United States Patent
Choi

(10) Patent No.: US 9,159,693 B2
(45) Date of Patent: Oct. 13, 2015

(54) HYBRID SUBSTRATE WITH HIGH DENSITY AND LOW DENSITY SUBSTRATE AREAS, AND METHOD OF MANUFACTURING THE SAME

(71) Applicant: SAMSUNG ELECTRO-MECHANICS CO., LTD., Suwon (KR)

(72) Inventor: Jin Won Choi, Yongin (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/063,699

(22) Filed: Oct. 25, 2013

(65) Prior Publication Data

US 2014/0175672 A1 Jun. 26, 2014

(30) Foreign Application Priority Data

Dec. 21, 2012 (KR) .......................... 10-2012-0150694

(51) Int. Cl.
    *H01L 23/48* (2006.01)
    *H01L 23/00* (2006.01)
    *H01L 23/498* (2006.01)
    *H05K 3/46* (2006.01)
    *H05K 1/18* (2006.01)
    *H05K 3/00* (2006.01)

(52) U.S. Cl.
    CPC .......... *H01L 24/80* (2013.01); *H01L 23/49822* (2013.01); *H01L 23/49833* (2013.01); *H05K 3/4688* (2013.01); *H01L 24/16* (2013.01); *H01L 2224/16225* (2013.01); *H05K 1/183* (2013.01); *H05K 1/185* (2013.01); *H05K 3/0097* (2013.01); *H05K 2201/0187* (2013.01); *H05K 2201/09727* (2013.01); *H05K 2203/061* (2013.01); *H05K 2203/063* (2013.01); *H05K 2203/1536* (2013.01)

(58) Field of Classification Search
    CPC ...................... H01L 24/48–24/49; H01L 24/80
    See application file for complete search history.

(56) References Cited

U.S. PATENT DOCUMENTS

| 2010/0019368 A1* | 1/2010 | Shin ............................. 257/686 |
| 2011/0048780 A1* | 3/2011 | Jeong et al. ................... 174/260 |
| 2012/0049368 A1* | 3/2012 | Tanaka .......................... 257/741 |
| 2012/0091496 A1* | 4/2012 | Chien et al. .................... 257/99 |
| 2012/0100671 A1* | 4/2012 | Kim .............................. 438/118 |
| 2014/0175679 A1* | 6/2014 | Kwon et al. ................... 257/784 |

FOREIGN PATENT DOCUMENTS

JP    2010-141282    6/2010

* cited by examiner

*Primary Examiner* — A. Sefer
(74) *Attorney, Agent, or Firm* — NSIP Law

(57) ABSTRACT

Provided is a hybrid substrate with high density and low density substrate areas and a method of manufacturing the same. The hybrid substrate with high density and low density substrate areas includes a low density substrate layer having a cavity and a low density area, a high density substrate layer mounted in the cavity of the low density substrate layer and formed of a high density area having a higher pattern density than that of the low density area, an insulating support layer comprising a deposition area formed on upper portions, lower portions and the upper and lower portions of the high density substrate layer and the low density substrate layer, insulating layer vias passing through the deposition area of the insulating support layer and connected to patterns of the high density substrate layer and the low density substrate layer, and an outer pattern layer.

3 Claims, 5 Drawing Sheets

“HYBRID SUBSTRATE WITH HIGH DENSITY AND LOW DENSITY SUBSTRATE AREAS, AND METHOD OF MANUFACTURING THE SAME”

CROSS-REFERENCE TO RELATED APPLICATIONS

This application claims the benefit of Korean Patent Application No. 10-2012-0150694 filed with the Korea Intellectual Property Office on Dec. 21, 2012, the disclosure of which is incorporated herein by reference.

BACKGROUND OF THE INVENTION

1. Field of the Invention

The present invention relates to a hybrid substrate with high density and low density substrate areas and a method of manufacturing the same, and more particularly, to a hybrid substrate with high density and low density substrate areas, in which a high density substrate layer is installed in a cavity of a low density substrate layer, and a method of manufacturing the same.

2. Description of the Related Art

In recent times, application of high integrated chips such as a flip chip or the like according to development of high speed devices is being gradually increased. An abrupt increase in number of input/output (I/O) units according to improvement in performance of the devices is caused by an abrupt reduction in line width of a substrate circuit. For this, a large amount of equipment investment of processes related to exposure, plating, etching, or the like, is needed. In order to minimize the investment and deal with high density devices, a technique of integrating both of a high density circuit substrate and a low density circuit substrate is needed.

Here, when high density and low density circuits are packaged together, for example, the high density circuit substrate is applied to a substrate, a portion of which is directly connected to a chip, in proportion to integration of the device, and the low density circuit substrate is applied to a substrate, a portion of which is connected to a mother board.

In a conventional package of the high density and low density substrates, a high density substrate layer is mounted on a low density substrate layer. However, when the high density substrate layer is mounted on the low density substrate layer, a thickness of the substrate may be increased, and the thickness of the substrate may be severely varied.

RELATED ART DOCUMENT

Patent Document

[PATENT DOCUMENT] Japanese Patent Application Laid-Open No. 2010-141282 (Published on Jun. 24, 2010)

SUMMARY OF THE INVENTION

The present invention has been invented in order to overcome the above-described problems and it is, therefore, an object of the present invention to propose a technique of mounting a high density substrate layer in a cavity of a low density substrate layer to provide a compact package with no variation in thickness.

In accordance with a first embodiment of the present invention to achieve the object, there is provided a hybrid substrate with high density and low density substrate areas, including: a low density substrate layer having a cavity formed at an intermediate area thereof and a low density area having a low pattern density around the cavity; a high density substrate layer mounted in the cavity of the low density substrate layer and formed of a high density area having a higher pattern density than that of the low density area; an insulating support layer comprising a deposition area formed on upper portions, lower portions and the upper and lower portions of the high density substrate layer and the low density substrate layer; insulating layer vias passing through the deposition area of the insulating support layer and connected to patterns of the high density substrate layer and the low density substrate layer; and an outer pattern layer comprising circuit patterns connected to the insulating layer vias and formed on the deposition area of the insulating support layer.

Here, in an example, the hybrid substrate with high density and low density substrate areas may further include a first protection layer formed on the insulating support layer to expose the circuit patterns of the outer pattern layer to the outside.

In addition, in an example, the insulating support layer is constituted by a filled area filled in a space between the high density substrate layer and the cavity, and a deposition area formed on the upper portion or the lower portion of the high density substrate layer and low density substrate layer, and the hybrid substrate may further includes a second protection layer formed on the remaining lower or upper portion of the high density substrate layer and low density substrate layer such that the circuit pattern formed on the remaining lower or upper portion of the high density substrate layer and low density substrate layer, in which the insulating support layer is not formed, is exposed.

In another example, an IC chip may be mounted on the circuit pattern formed and exposed on the high density substrate layer.

Next, in accordance with a second embodiment of the present invention to achieve the object, there is provided a hybrid substrate with high density and low density substrate areas, including: a base substrate layer; a low density substrate layer formed on the base substrate layer and having a cavity formed at an intermediate area thereof and a low density area having a low pattern density around the cavity; a high density substrate layer mounted on the base substrate layer in the cavity of the low density substrate layer and constituted by a high density area having a higher pattern density than that of the low density area; an insulating support layer comprising a deposition area formed on the high density substrate layer and the low density substrate layer; insulating layer vias passing the deposition area of the insulating support layer and connected to patterns of the high density substrate layer and the low density substrate layer; and an outer pattern layer comprising circuit patterns connected to the insulating layer vias and formed on the deposition area of the insulating support layer.

Here, in an example, the hybrid substrate with high density and low density substrate areas may further include a protection layer formed on the insulating support layer to expose the circuit patterns of the outer pattern layer to the outside.

In addition, in an example, the insulating support layer may be constituted by a filled area filled in a space between the high density substrate layer and the cavity and a deposition area formed on the high density substrate layer and the low density substrate layer.

In addition, according to an example, the base substrate layer may be a single-layered or multi-layered structure.

In another example, an IC chip may be mounted on the circuit patterns formed on the high density substrate layer.

Next, in accordance with a third embodiment of the present invention to achieve the object, there is provided a method of manufacturing a hybrid substrate with high density and low density substrate areas, including: preparing a low density substrate layer having a cavity formed at an intermediate area thereof and a low density area having a low pattern density around the cavity; mounting a high density substrate layer constituted by a high density area having a higher pattern density than that of the low density area in the cavity of the low density substrate layer; forming an insulating support layer comprising a deposition area in which the insulating material is deposited on upper portions, lower portions or the upper and lower portions of the high density substrate layer and the low density substrate layer; forming insulating layer via-holes passing through the deposition area of the insulating support layer and configured to expose patterns of the high density substrate layer and low density substrate layer; and forming an outer pattern layer by filling the insulating layer via-holes to form insulating layer vias and forming circuit patterns on the deposition area of the insulating support layer to be connected to the insulating layer vias.

Here, according to an example, in preparing the low density substrate layer, the low density substrate layer having the cavity is attached to one surface or both surfaces of a carrier substrate, in mounting the high density substrate layer, the high density substrate layer is inserted into the cavity to attach the high density substrate layer onto the carrier substrate, and in forming the insulating support layer, the insulating material is deposited and pressed onto surfaces of the high density substrate layer and the low density substrate layer to fill a space of the cavity in which the high density substrate layer is mounted, and form the deposition area of the surfaces of the high density substrate layer and low density substrate layer.

Here, according to an example, when the deposition area in which the insulating material is deposited on and under the high density substrate layer and the low density substrate layer is formed, forming the insulating support layer may include: a first insulating support layer forming step of depositing and pressing the insulating material onto first surfaces of the high density substrate layer and low density substrate layer exposed to the outside through mounting the high density substrate layer, filling a space of the cavity in which the high density substrate layer is mounted, and forming the deposition area on the first surfaces of the high density substrate layer and the low density substrate layer; and a second insulating support layer forming step of removing the carrier substrate after removing the carrier substrate after the first insulating support layer forming step or forming the insulating layer via-holes and forming the outer pattern layer after the first insulating support layer forming step, and depositing and pressing the insulating material onto second surfaces of the high density substrate layer and the low density substrate layer, from which the carrier substrate is removed, to form a second surface deposition area.

In addition, according to an example, the method of manufacturing the hybrid substrate with high density and low density substrate areas may further include, after forming the outer pattern layer, forming a first protection layer on the insulating support layer to expose the circuit patterns of the outer pattern layer to the outside.

According to another example, in forming the insulating support layer, the insulating material is deposited and pressed onto the first surfaces of the high density substrate layer and the low density substrate layer exposed to the outside through mounting the high density substrate layer to fill the space of the cavity in which the high density substrate layer is mounted, and form the deposition area on the first surfaces of the high density substrate layer and the low density substrate layer, and the method may further include: a carrier removal step of removing the carrier substrate after forming the outer pattern layer; and a protection layer forming step of forming a first protection layer on the insulating support layer to expose the circuit patterns of the outer pattern layer to the outside, and forming a second protection layer on the second surfaces of the high density substrate layer and the low density substrate layer to expose the circuit patterns formed on the second surfaces of the high density substrate layer and the low density substrate layer, from which the carrier substrate is removed.

Next, in accordance with a fourth embodiment of the present invention to achieve the object, there is provided a method of manufacturing a hybrid substrate with high density and low density substrate areas, including: preparing a base substrate layer; forming a low density substrate layer having a cavity formed in an intermediate area thereof and a low density area having a low pattern density around the cavity on the base substrate layer; mounting a high density substrate layer constituted by a density area having a higher pattern density than that of the low density area on the base substrate layer in the cavity of the low density substrate layer; forming an insulating support layer comprising the deposition area on which the insulating material is deposited on the high density substrate layer and the low density substrate layer; forming insulating layer via-holes passing through the deposition area of the insulating support layer and configured to expose the patterns of the high density substrate layer and the low density substrate layer; and forming an outer pattern layer by filling the insulating layer via-holes to form insulating layer vias and forming circuit patterns on the deposition area of the insulating support layer to be connected to the insulating layer vias.

Here, in one example, the method of manufacturing the hybrid substrate with high density and low density substrate areas may further include forming a protection layer on the insulating support layer to expose the circuit patterns of the outer pattern layer to the outside.

In addition, in one example, in forming the insulating support layer, the insulating material may be deposited and pressed on the high density substrate layer and the low density substrate layer to fill a space between the high density substrate layer and the cavity and form the deposition area on the high density substrate layer and the low density substrate layer.

Further, according to an example, the base substrate layer may be a single-layered or multi-layered structure.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
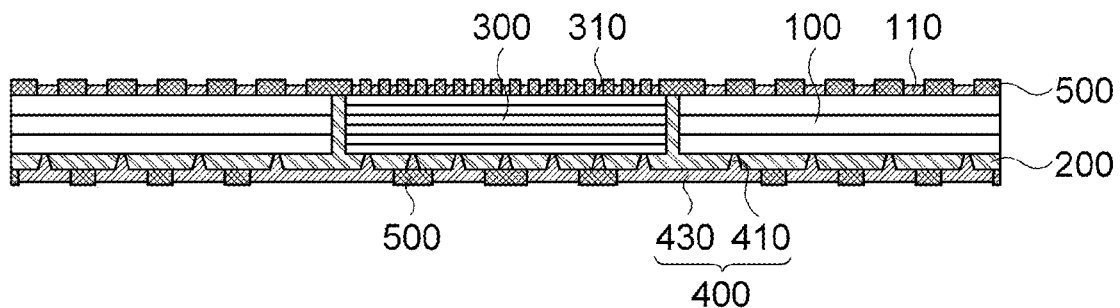
FIG. 1 is a cross-sectional view schematically showing a hybrid substrate with high density and low density substrate areas according to an embodiment of the present invention.

Hereinafter, an exemplary embodiment of the present invention will be described in detail with reference to the accompanying drawings. To clearly describe the present invention, parts not relating to the description are omitted from the drawings. Like numerals refer to like elements throughout the description of the drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

As used herein, the singular forms "a", "an" and "the" are intended to include the plural forms as well, unless the context clearly indicates otherwise. It will be further understood that the terms "comprises" and/or "comprising," when used in this specification, specify the presence of stated components, motions, and/or devices, but do not preclude the presence or addition of one or more other components, motions, and/or devices thereof.

Therefore, the present invention should not be construed as limited to the embodiments set forth herein and may be embodied in different forms. And, the size and the thickness of an apparatus may be overdrawn in the drawings for the convenience of explanation.

First, a hybrid substrate with high density and low density substrate areas according to a first embodiment of the present invention will be described with reference to the accompanying drawings. Here, reference numerals, which are not designated in the referenced drawings, may be reference numerals of another drawing representing the same configuration.

FIG. 1 is a cross-sectional view schematically showing a hybrid substrate with high density and low density substrate areas according to an embodiment of the present invention, and FIGS. 2a to 2g are views schematically showing steps of a method of manufacturing a hybrid substrate with high density and low density substrate areas according to FIG. 1.

Referring to FIGS. 1 and/or 2f, a hybrid substrate with high density and low density substrate areas according to one example may include a low density substrate layer 100, a high density substrate layer 300, an insulating support layer 200, insulating layer vias 410 and an outer pattern layer 430. In addition, according to another example, a hybrid substrate with high density and low density substrate areas may further include a first protection layer 500. In still another example, a hybrid substrate with high density and low density substrate areas may further include a second protection layer 500.

Specifically, referring to FIGS. 1 and/or 2f, the low density substrate layer 100 has a cavity (see reference numeral 150 of FIG. 2a) formed at an intermediate area thereof. The cavity 150 of the low density substrate layer 100 is an area on which the high density substrate layer 300 is mounted. For example, the cavity 150 may be a space passing through the low density substrate layer 100. The low density substrate layer 100 is formed of a low density area having a low pattern density around the cavity 150. Conventionally, a difference between the low density circuit substrate and the high density circuit substrate can be distinguished according to a pattern density, for example, a difference in width of a circuit pattern and a difference in gap between patterns. For example, here, in the case of the high density, a width of the pattern line is set to about 8 μm, and a gap between the pattern lines is set to about 12 μm. On the other hand, in the case of the low density, the width and gap of the pattern lines are set to about 35~40 μm. In order to form a high density circuit, a semi-additive process (SAP) or a modified semi-additive process (MSAP) may be used, and the other hand, in order to form a low density circuit, a tenting method may be used to form a circuit pattern. In addition, conventionally, a surface roughness of an insulating layer of the low density circuit substrate, for example, using a copper clad laminate (CCL), is higher than that of the high density circuit substrate.

In addition, referring to FIGS. 1 and/or 2f, the high density substrate layer 300 has a high density area having a higher pattern density than that of the low density area of the low density substrate layer 100. In addition, the high density substrate layer 300 is mounted in the cavity 150 of the low density substrate layer 100.

Next, referring to FIGS. 1 and/or 2f, the insulating support layer 200 is formed. The insulating support layer 200 is coupled to the low density substrate layer 100 and the high density substrate layer 300 mounted in the cavity 150 of the hybrid substrate according to the embodiment to support each other. The insulating support layer 200 may be formed of a deposition area. Here, the deposition area of the insulating support layer 200 is an area in which an insulating material is deposited on upper portions, lower portions or the upper and lower portions of the high density substrate layer 300 and the low density substrate layer 100. The insulating material forming the insulating support layer 200 may be a dielectric material, and a well-known insulating layer used for a substrate may be used as the insulating material.

For example, in one example, the insulating support layer 200 may be constituted by a filled area formed in a space between the high density substrate layer 300 and the cavity 150 and filled with the insulating material, and a deposition area in which the insulating material is deposited on the upper portions or the lower portions of the high density substrate layer 300 and the low density substrate layer 100.

FIGS. 1 and/or 2f show that the insulating support layer 200 is formed on the upper portions or the lower portions of the high density substrate layer 300 and the low density substrate layer 100. While not shown, the insulating support layer 200 may be formed on both of the upper and lower surfaces of the high density substrate layer 300 and the low density substrate layer 100. In addition, while the insulating support layer 200 is shown as a single-layered structure in FIGS. 1 and/or 2f, the insulating support layer 200 having a multi-layered structure may be formed according to an application example.

Next, referring to FIGS. 1 and/or 2f, the insulating layer vias 410 is formed. The insulating layer vias 410 pass through the deposition area of the insulating support layer 200 and are connected to patterns of the high density substrate layer 300 and the low density substrate layer 100. Here, insulating layer vias 410 connect the patterns of the high density substrate layer 300 and the low density substrate layer 100 to circuit patterns 430 on the insulating support layer 200, respectively. The insulating layer vias 410 may be formed of a conductive metal material, for example, a Cu material.

Next, referring to FIGS. 1 and/or 2f, the outer pattern layer 430 is formed. The outer pattern layer 430 is formed on the deposition area of the insulating support layer 200. Here, the outer pattern layer 430 includes the circuit patterns 430 connected to the insulating layer vias 410 passing through the deposition area of the insulating support layer 200. The outer pattern layer 430 may be formed of a conductive metal material such as Cu or the like. For example, at least one insulating layer via 410 passing through the insulating support layer 200 and connected to the pattern of the high density substrate layer 300 and at least one insulating layer via 410 passing through the insulating support layer 200 and connected to the pattern of the low density substrate layer 100 may be connected by the circuit pattern 430 on the insulating support layer 200.

In addition, referring to one example with reference to FIG. 1, the hybrid substrate with high density and low density substrate areas may further include the first protection layer 500. Here, the first protection layer 500 is formed on the insulating support layer 200 to expose the circuit patterns 430 of the outer pattern layer 430 to the outside. For example, the first protection layer 500 may be a solder resist layer.

Further, referring to FIG. 1, in one example, the hybrid substrate with high density and low density substrate areas may further include the second protection layer 500. In one example, the deposition area of the insulating support layer 200 may be formed on the upper portions or the lower portions of the high density substrate layer 300 and the low density substrate layer 100. Here, the second protection layer 500 is formed on the remaining lower or upper portions of the high density substrate layer 300 and the low density substrate layer 100, on which the insulating support layer 200 is not formed. Similar to the first protection layer 500, the second protection layer 500 is formed on the remaining lower or upper portions of the high density substrate layer 300 and the low density substrate layer 100 to expose the circuit patterns 310 and 110 formed on the remaining lower or upper portions of the high density substrate layer 300 and the low density substrate layer 100. For example, the second protection layer 500 may be a solder resist layer.

In addition, while not shown, in one example, An IC chip (not shown) may be mounted on the circuit patterns 310 formed on the high density substrate layer 300 and exposed to the outside.

Next, a hybrid substrate with high density and low density substrate areas according to a second embodiment of the present invention will be described in detail with reference to the accompanying drawings. Here, the hybrid substrate with high density and low density substrate areas according to the first embodiment will be referenced, and thus, overlapping description thereof will be omitted.

Figure 3:
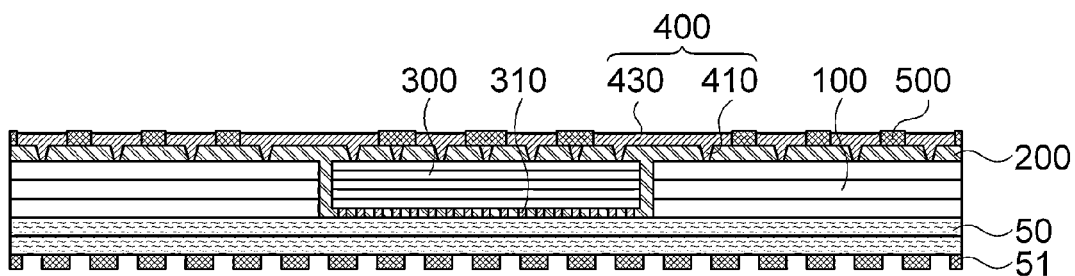
FIG. 3 is a cross-sectional view schematically showing a hybrid substrate with high density and low density substrate areas according to another embodiment of the present invention.

FIG. 3 is a cross-sectional view schematically showing a hybrid substrate with high density and low density substrate areas according to another embodiment of the present invention, and FIGS. 4a to 4f are views schematically showing steps of a method of manufacturing a hybrid substrate with high density and low density substrate areas according to FIG. 3.

Referring to FIGS. 3 and/or 4e, the hybrid substrate with high density and low density substrate areas according to one example includes a base substrate layer 50, a low density substrate layer 100, a high density substrate layer 300, an insulating support layer 200, insulating layer vias 410 and an outer pattern layer 430. In addition, referring to FIG. 3, in one example, the hybrid substrate with high density and low density substrate areas may further include a protection layer 500.

Referring to FIGS. 3 and/or 4e, the base substrate layer 50 is formed. For example, in one example, the base substrate layer 50 may be a single-layered or multi-layered structure. While the base substrate layer 50 having the multi-layered structure is shown in FIG. 3, the single-layered structure is also possible. The base substrate layer 50 may be formed of the same material as the low density substrate layer or a well-known substrate material. In addition, the base substrate layer 50 may be formed of a well-known core substrate material.

In addition, referring to FIGS. 3 and/or 4e, the low density substrate layer 100 is formed. The low density substrate layer 100 is formed on the base substrate layer 50. Here, the low density substrate layer 100 has a cavity (see reference numeral 150 of FIG. 4a) in an intermediate area thereof. Further, the low density substrate layer 100 is formed of a low density area having a low pattern density around the cavity 150.

Next, referring to 3 and/or 4e, the high density substrate layer 300 is formed. The high density substrate layer 300 is mounted on the base substrate layer 50 in the cavity 150 of the low density substrate layer 100. The high density substrate layer 300 is formed of a high density area having a higher pattern density than that of the low density area of the low density substrate layer 100.

Next, referring to FIGS. 3 and/or 4e, the insulating support layer 200 is formed. The insulating support layer 200 may be formed of a deposition area. The deposition area of the insulating support layer 200 is an area in which an insulating material is deposited on the high density substrate layer 300 and the low density substrate layer 100.

For example, in one example, the insulating support layer 200 may be constituted by a filled area in which an insulating material is filled in a space between the high density substrate layer 300 and the cavity 150, and a deposition area in which an insulating material is deposited on the high density substrate layer 300 and the low density substrate layer 100.

The insulating material forming the insulating support layer 200 is a dielectric material, and a well-known insulating layer used for a substrate may be used as the insulating material. In addition, while the insulating support layer 200 is shown as a single-layered structure in FIGS. 3 and/or 4f, the insulating support layer 200 may have a multi-layered structure according to an application example.

Next, referring to FIGS. 3 and/or 4e, insulating layer vias 410 are formed. The insulating layer vias 410 pass through the deposition area of the insulating support layer 200 and are connected to patterns of the high density substrate layer 300 and the low density substrate layer 100. The insulating layer vias 410 and the outer pattern layer 430 may be formed of a conductive metal material such as Cu or the like.

Next, referring to FIGS. 3 and/or 4e, an outer pattern layer 430 is formed. The outer pattern layer 430 is formed on the deposition area of the insulating support layer 200. Here, the outer pattern layer 430 includes circuit patterns 430 connected to the insulating layer vias 410.

Reviewing another example with reference to FIG. 3, the hybrid substrate with high density and low density substrate areas may further include a protection layer 500. Here, the protection layer 500 is formed on the insulating support layer 200 to expose the circuit patterns of the outer pattern layer 430 to the outside. For example, the protection layer 500 may be a solder resist layer.

While not shown, in one example, an IC chip (not shown) may be mounted on the circuit pattern formed on the high density substrate layer 300 and exposed to the outside. Here, different from FIG. 3, the circuit patterns 310 of the high density substrate layer 300 may be formed to be directed to an opposite side of a base substrate layer 50, and here, the circuit patterns 310 of the high density substrate layer 300 may be exposed, not covered by the insulating support layer 200 and the protection layer 500, and the IC chip may be mounted thereon.

Next, a method of manufacturing a hybrid substrate with high density and low density substrate areas according to a third embodiment of the present invention will be described with reference to the accompanying drawings. Here, the hybrid substrate with high density and low density substrate areas according to the first embodiment and FIG. 1 will be referenced, and thus, overlapping description thereof will be omitted.

FIGS. 2a to 2g are views schematically showing steps of the method of manufacturing the hybrid substrate with high density and low density substrate areas according to FIG. 1.

Figure 2A:
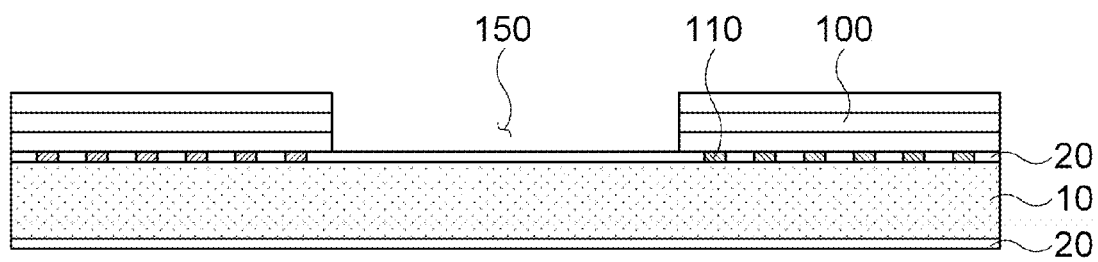
FIGS. 2a to 2g are views schematically showing steps of a method of manufacturing a hybrid substrate with high density and low density substrate areas according to FIG. 1.
Figure 2B:
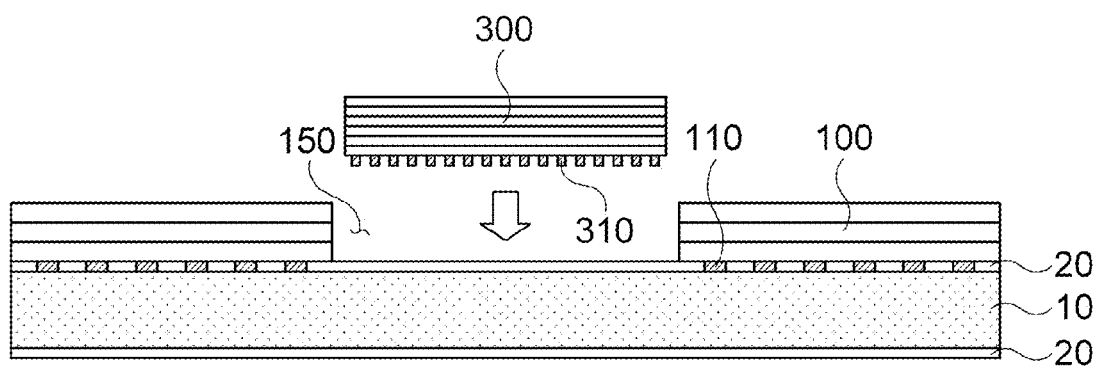
Figure 2C:
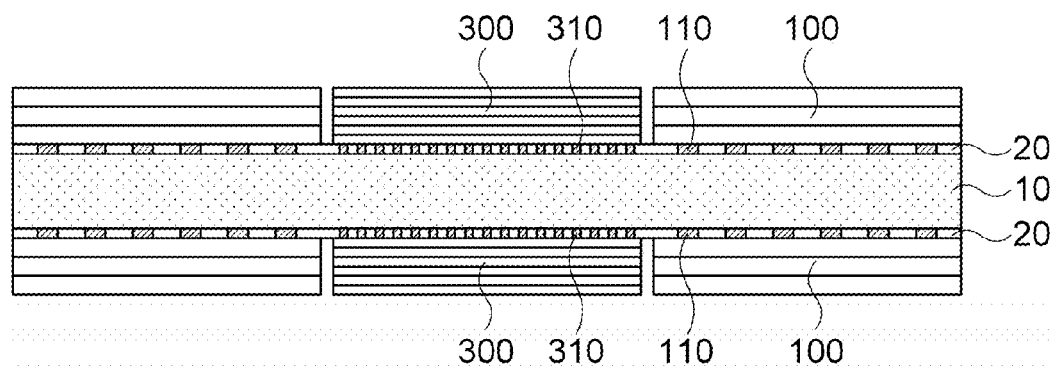
Figure 2D:
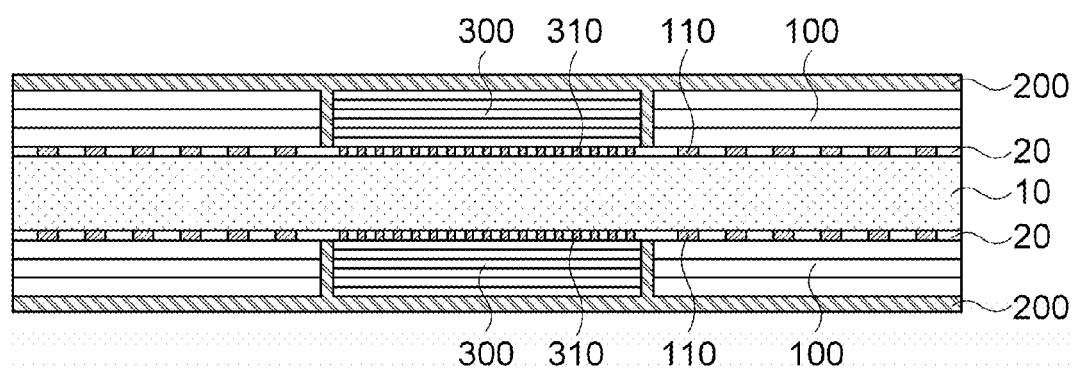
Figure 2E:
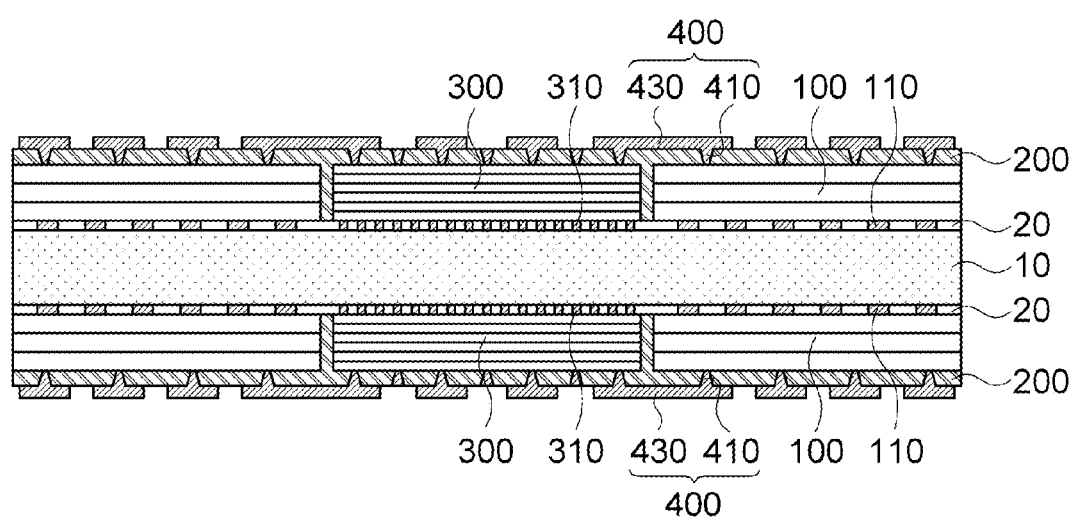
Figure 2F:
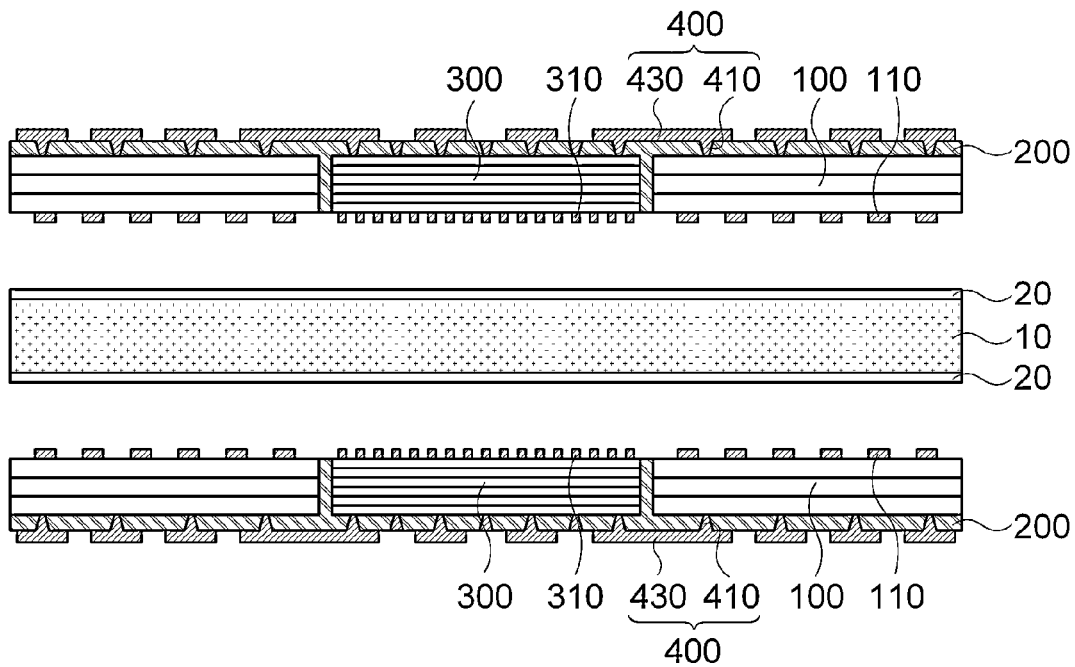

Referring to FIGS. 2A to 2F, the method of manufacturing the hybrid substrate with high density and low density substrate areas according to one example may include a low density substrate layer preparation step (see FIG. 2a), a high density substrate layer mounting step (see FIGS. 2b and 2c), an insulating support layer forming step (see FIG. 2d), an insulating layer via-hole forming step (see FIG. 2e), and a via and outer pattern layer forming step (see FIGS. 2e and 2f). In addition, referring further to FIG. 2g, the method of manufacturing the hybrid substrate with high density and low density substrate areas according to another example may further include a protection layer forming step.

The method will be described in detail with reference to FIGS. 2a to 2g.

First, in the low density substrate layer preparation step, a low density substrate layer 100 is prepared. Here, the low density substrate layer 100 has a cavity 150 formed at an intermediate area thereof and a low density area having a low pattern density around the cavity 150. Conventionally, a difference between a low density circuit substrate and a high density circuit substrate may be distinguished according to a pattern density, for example, a difference in with of a circuit pattern and a difference in gap between patterns. Here, a pattern forming process of the circuit pattern is distinguished. For example, in order to form the high density circuit pattern, a semi-additive process (SAP) or a modified semi-additive process (MSAP) may be used, and the other hand, in order to form a low density circuit, a method of etching a copper clad laminate (CCL) through a tenting method or the like is used.

For example, referring to FIG. 2a, in one example, in the low density substrate layer preparation step, the low density substrate layer 100 having the cavity 150 is attached to one surface or both surfaces of a carrier substrate 10. In FIG. 2a, while the low density substrate layer 100 is attached to one surface of the carrier substrate 10, referring to FIG. 2c, the low density substrate layer 100 may be attached to both surfaces of the carrier substrate 10. Here, an adhesive film 20 configured to attach the low density substrate layer 100 is formed on the carrier substrate 10. Referring to FIG. 2f, the carrier substrate 10 is removed in the late process of the method of manufacturing the hybrid substrate with high density and low density substrate areas.

Next, the high density substrate layer mounting step will be described. In the high density substrate layer mounting step, a high density substrate layer 300 is mounted in the cavity 150 of the low density substrate layer 100. Here, the high density substrate layer 300 has a high density area having a higher pattern density than that of the low density area of the low density substrate layer 100.

For example, referring to FIGS. 2b and 2c, in the high density substrate layer mounting step, the high density substrate layer 300 can be inserted into the cavity 150 and the high density substrate layer 300 can be attached onto the carrier substrate 10.

Next, the insulating support layer forming step will be described. In the insulating support layer forming step, an insulating support layer 200. Here, the insulating support layer 200 includes a deposition area. That is, the deposition area of the insulating support layer 200 is formed by depositing an insulating material on upper portions, lower portions or the upper and lower portions of the high density substrate layer 300 and the low density substrate layer 100. The insulating material is a dielectric material, and a well-known insulating layer used for a substrate may be used. In addition, while the insulating support layer 200 is shown as a single-layered structure in FIGS. 2d and 2e, the insulating support layer 200 having a multi-layered structure may be formed according to an application example.

For example, referring to FIG. 2d, in the insulating support layer forming step, the insulating material can be deposited and pressed on surfaces of the high density substrate layer 300 and the low density substrate layer 100 to form the insulating support layer 200. That is, the insulating material can be deposited and pressed on the surfaces of the high density substrate layer 300 and the low density substrate layer 100 to fill a space of the cavity 150 in which the high density substrate layer 300 is mounted, and the insulating material can be deposited and pressed onto the surfaces of the high density substrate layer 300 and the low density substrate layer 100 to form the deposition area.

In FIG. 2d, the insulating material is deposited and pressed onto the upper portions or the lower portions of the high density substrate layer 300 and the low density substrate layer 100 to form the insulating support layer 200.

While not shown, after the carrier substrate 10 removed in FIG. 2f, the insulating material can also be deposited and pressed onto the surfaces of the high density substrate layer 300 and the low density substrate layer 100, from which the carrier substrate 10 is removed, to form the insulating support layer 200. In this case, the insulating support layer 200 may be formed at both surfaces of the upper and lower portions of the high density substrate layer 300 and the low density substrate layer 100.

According to one example, the case that the deposition area in which the insulating material is deposited on the upper and lower portions of the high density substrate layer 300 and the low density substrate layer 100 is formed will be described. Here, the insulating support layer forming step may include a first insulating support layer forming step and a second insulating support layer forming step. In the first insulating support layer forming step, for example, as shown in FIG. 2d, the insulating material is deposited and pressed onto first surfaces of the high density substrate layer 300 and the low density substrate layer 100 exposed to the outside through the high density substrate layer mounting step to form a first insulating support layer 200. That is, the insulating material is deposited and pressed onto the first surfaces of the high density substrate layer 300 and the low density substrate layer 100 to fill the space of the cavity 150, in which the high density substrate layer 300 is mounted, and form the deposition area on the first surfaces of the high density substrate layer 300 and the low density substrate layer 100. For example, in another example in which the insulating support layer 200 is formed on only one surface of the high density substrate layer 300 and the low density substrate layer 100, as shown and described in FIG. 2d, the insulating support layer forming step may be formed of only the first insulating support layer forming step.

Next, while not shown, the second insulating support layer forming step may be performed after the carrier substrate 10 is removed after the first insulating support layer forming step of FIG. 2d, or after the carrier substrate 10 is removed as shown in FIG. 2f after the insulating layer via-hole forming step after the first insulating support layer forming step of FIG. 2d and after the via and outer pattern layer forming step of FIG. 2e. That is, in the second insulating support layer forming step, the insulating material may be deposited and pressed onto second surfaces of the high density substrate layer 300 and the low density substrate layer 100, from which the carrier substrate 10 is removed, to form a second insulating support layer 200. For example, in the first insulating support layer forming step, since a space of the cavity 150 in which the high density substrate layer 300 is mounted is filled, in the second insulating support layer forming step, the second surface deposition area can be formed by depositing the insulating material on the second surfaces of the high density substrate layer 300 and the low density substrate layer 100.

Next, the insulating layer via-hole forming step will be described. In the insulating layer via-hole forming step, insulating layer via-holes passing through the deposition area of the insulating support layer 200 are processed. According to the processing of the insulating layer via-holes, patterns of the high density substrate layer 300 and the low density substrate layer 100 are exposed. While not shown, the insulating layer via-holes are formed such that the insulating layer vias 410, which are designated by reference numeral 410 shown in FIG. 2e, pass through the deposition area of the insulating support layer 200. The via-hole processing may be performed by a well-known substrate via-hole processing method, i.e., the via-holes may be processed through, for example, chemical etching, photolithography, laser processing or $CO_2$ processing.

Next, the via and outer pattern layer forming step will be described. In the via and outer pattern layer forming step, the insulating layer via-holes are filled to form the insulating layer vias 410, and the circuit patterns 430 are formed on the deposition area of the insulating support layer 200 to form the outer pattern layer 430. Here, the circuit patterns on the deposition area of the insulating support layer 200 are formed to be connected to the insulating layer vias 410. For example, the via-hole filling and the circuit pattern plating may be performed through a method such as Cu plating or the like. Here, the plating method may be a well-known pattern plating method. A conductive metal material such as Cu is used as a plating material.

Figure 2G:
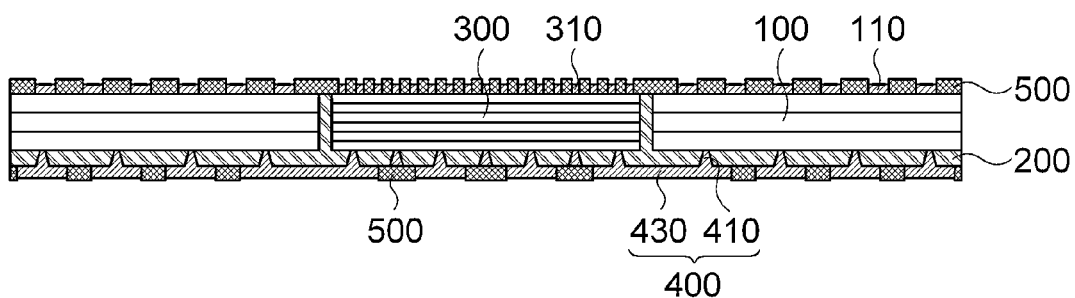

Referring to FIG. 2g, the method of manufacturing the hybrid substrate with high density and low density substrate areas according to another example may further include a protection layer forming step. Here, the protection layer 500 may be a solder resist layer.

For example, according to one example, the method of manufacturing the hybrid substrate with high density and low density substrate areas may include a first protection layer forming step as the protection layer forming step. Here, in the first protection layer forming step, the first protection layer 500 may be formed on the insulating support layer 200 to expose the circuit patterns of the outer pattern layer 430 after the via and outer pattern layer forming step of FIG. 2e. For example, the protection layer 500 formed on the insulating support layer 200 to expose the circuit patterns of the outer pattern layer 430 in FIG. 2g becomes the first protection layer 500.

In addition, referring to FIGS. 2f and 2g, in one example, the method of manufacturing the hybrid substrate may include a carrier removal step (see FIG. 2f) and a protection layer forming step (see FIG. 2g). Referring to FIG. 2f, in the carrier removal step, the carrier substrate 10 is removed after the via and outer pattern layer forming step of FIG. 2e. Further, referring to FIG. 2g, in the protection layer forming step, the first protection layer and the second protection layer 500 are formed. Here, the first protection layer 500 is formed on the insulating support layer 200 to expose the circuit patterns of the outer pattern layer 430 to the outside. In addition, the second protection layer 500 is formed on the second surfaces of the high density substrate layer 300 and the low density substrate layer 100 to expose the circuit patterns formed on the second surfaces of the high density substrate layer 300 and the low density substrate layer 100, from which the carrier substrate 10 is removed.

Next, a method manufacturing a hybrid substrate with high density and low density substrate areas according to a fourth embodiment of the present invention will be described in detail with reference to the accompanying drawings. Here, the hybrid substrate with high density and low density substrate areas according to the second embodiment, the method of manufacturing the hybrid substrate with high density and low density substrate areas according to the third embodiment and FIG. 3 will be referenced and overlapping description thereof will be omitted.

FIGS. 4a to 4f are views schematically showing steps of the method of manufacturing the hybrid substrate with high density and low density substrate areas according to FIG. 3.

Figure 4A:
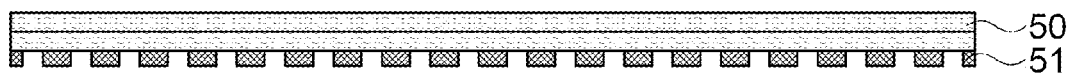
FIGS. 4a to 4f are views schematically showing steps of a method of manufacturing a hybrid substrate with high density and low density substrate areas according to FIG. 3.
Figure 4B:
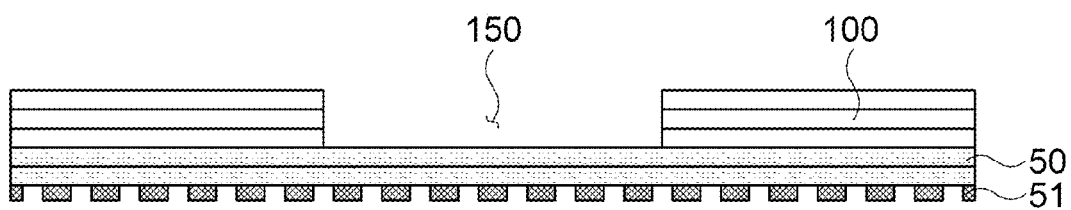
Figure 4C:
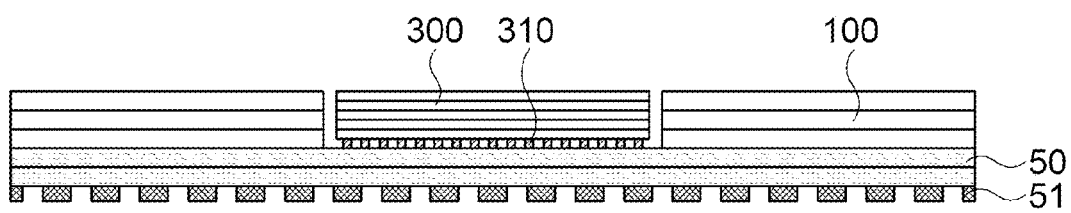
Figure 4D:
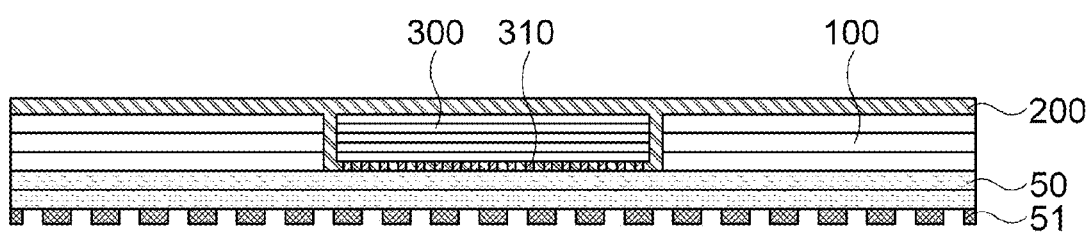
Figure 4E:
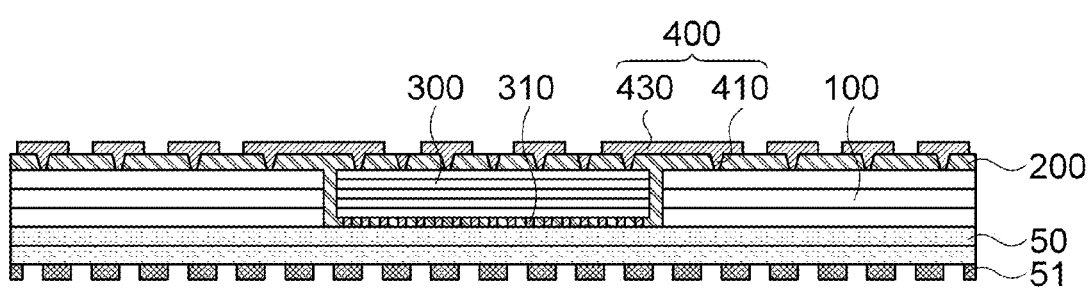

Referring to FIGS. 4a to 4e, the method of manufacturing the hybrid substrate with high density and low density substrate areas according to one example may include a base substrate preparation step (see FIG. 4a), a low density substrate layer forming step (see FIG. 4b), a high density substrate layer mounting step (see FIG. 4c), an insulating support layer forming step (see FIG. 4d), an insulating layer via-hole forming step (see FIG. 4e), and a via and outer pattern layer forming step (see FIG. 4e). In addition, referring to FIG. 4f, a method of manufacturing a hybrid substrate with high density and low density substrate areas according to still another example may further include a protection layer forming step.

Referring to FIG. 4a, in the base substrate preparation step, a base substrate layer 50 is prepared. Here, in one example, the base substrate layer 50 may be a single-layered or multi-layered structure. The base substrate layer 50 may be formed of the same material as the low density substrate layer, a well-known substrate material or a well-known core material.

Next, the low density substrate layer forming step will be described with reference to FIG. 4b. In the low density substrate layer forming step, a low density substrate layer 100 is formed on the prepared base substrate layer 50. Here, the low density substrate layer 100 has a cavity 150 formed at an intermediate area thereof, and a low density area having a low pattern density around the cavity 150.

Next, the high density substrate layer mounting step will be described with reference to FIG. 4c. In the high density substrate layer mounting step, a high density substrate layer 300 is mounted on the base substrate layer 50 in the cavity 150 of the low density substrate layer 100 of the low density substrate layer 100. Here, the high density substrate layer 300 is formed of a high density area having a higher pattern density than that of the low density area of the low density substrate layer 100.

Next, referring to FIG. 4d, the insulating support layer forming step will be described. In the insulating support layer forming step, an insulating support layer 200 is formed. The insulating support layer 200 includes a deposition area, and here, the deposition area is an area in which an insulating material is deposited on the high density substrate layer 300 and the low density substrate layer 100. For example, in one example, referring to FIG. 4d, after the high density substrate layer mounting step of FIG. 4c, the insulating material is deposited and pressed onto the high density substrate layer 300 and the low density substrate layer 100 to fill a space of the cavity 150, in which the high density substrate layer 300 is mounted, with the insulating material, and the deposition area may be formed by the insulating material layer pressed on the high density substrate layer 300 and the low density substrate layer 100. The insulating material is a dielectric material, and a well-known insulating layer used for a substrate can be used. In addition, in FIG. 4d, while the insulating support layer 200 is shown as a single-layered structure, the insulating support layer 200 having a multi-layered structure may be formed according to an application example.

Next, the insulating layer via-hole forming step will be described. While not shown, referring to FIG. 4e, insulating layer via-holes, in which insulating layer vias 410 designated by reference numeral 410 are to be formed, are processed. In the insulating layer via-hole forming step, the insulating layer via-holes are formed to pass through the deposition area of the insulating support layer 200 and expose the patterns of the high density substrate layer 300) and the low density substrate layer 100. The via-hole may be performed by a well-known substrate via-hole processing method.

Next, the via and outer pattern layer forming step of FIG. 4e will be described. In the via and outer pattern layer forming step, the insulating layer via-holes are filled to form the insulating layer vias 410, and the circuit patterns are formed on the deposition area of the insulating support layer 200 to form the outer pattern layer 430. Here, the outer pattern layer 430 is formed to be connected to the insulating layer vias 410. The insulating layer via and the outer pattern layer 430 may be formed by the same method as that of the Cu plating method. Here, a conductive metal material such as Cu or the like may be used as a plating material, and the plating method may be a well-known pattern plating method.

Figure 4F:
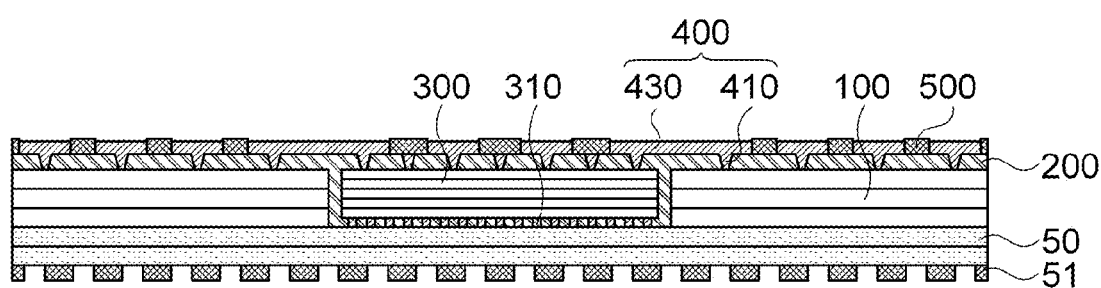

Referring to FIG. 4f, a method of manufacturing a hybrid substrate with high density and low density substrate areas according to another example may further include a protection layer forming step. Here, in the protection layer forming step, a protection layer 500 is formed on the insulating support layer 200 to expose the circuit patterns of the outer pattern layer 430 to the outside. For example, the protection layer 500 may be a solder resist layer.

The present invention proposes a technique of integrating the high density and low density circuits, applying the high density circuit substrate to the substrate directly connected to a chip such as a high integration device or the like in proportion to integration of the device, and applying a low density circuit to a substrate connected to a mother board or the like. Here, when the device to which the high density/low density circuit substrates are applied is packaged and applied to a final product such as a mobile phone or a PC, since a thickness of the package is increased to badly affect a thickness of the final product, which cause retrogression against a small and compact size of recent electronic appliances, the present invention uses the method of mounting the high density substrate in the cavity area of the low density substrate.

According to the embodiments of the present invention, the high density substrate layer area of the hybrid substrate package may be used to be connected to a high integration device such as a chip, and the low density substrate layer area may be used to be connected to a mother board or the like.

As can be seen from the foregoing, according to the embodiments of the present invention, the high density substrate layer is mounted in the cavity of the low density substrate layer to form a slim package without variation in thickness of the package.

Accordingly, while the package becomes slim without variation in thickness of the substrate package, the high density substrate layer area may be used to be connected to the high integration device such as a chip, and the low density substrate layer area may be used to be connected to a mother board or the like.

In addition, the device can be easily manufactured using conventional equipment to minimize equipment investment cost, and when specific requirements of a certain area of the substrate due to device characteristics are present, the area can be partially manufactured to enable connection thereof.

Further, process of forming patterns of the high density substrate and the low density substrate are different from each other, the high density substrate and the low density substrate are separately formed and the high density substrate is mounted in the cavity of the low density substrate so that the manufacturing method of the present invention becomes easy in comparison with a method in which a high density area and a low density area are formed together through different pattern forming processes on one substrate.

Embodiments of the invention have been discussed above with reference to the accompanying drawings. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention.

The invention claimed is:

1. A hybrid substrate with high density and low density substrate areas, comprising:
    a low density substrate layer having a cavity formed at an intermediate area thereof and a low density area having a low pattern density around the cavity;
    a high density substrate layer mounted in the cavity of the low density substrate layer and formed of a high density area having a higher pattern density than that of the low density area;
    an insulating support layer comprising an area in which an insulating material is deposited on upper portions, lower portions or the upper and lower portions of the high density substrate layer and the low density substrate layer,
    the insulating support layer constituted by a filled area filled in a space between the high density substrate layer and the cavity, and a deposition area formed on the upper portion or the lower portion of the high density substrate layer and low density substrate layer;
    insulating layer vias passing through the area of the insulating support layer and connected to patterns of the high density substrate layer and the low density substrate layer;
    an outer pattern layer comprising first circuit patterns connected to the insulating layer vias and being formed on the area of the insulating support layer; and
    a protection layer formed on the remaining lower or upper portion of the high density substrate layer and low density substrate layer, on which the insulating support layer is not formed to expose second circuit patterns formed on the remaining lower or upper portion of the high density substrate layer and low density substrate layer.

2. The hybrid substrate with high density and low density substrate areas according to claim 1, further comprising a further protection layer, formed on the insulating support layer to expose the circuit patterns of the outer pattern layer to the outside.

3. The hybrid substrate with high density and low density substrate areas according to claim 1, wherein an IC chip is mounted on the second circuit patterns formed and exposed on the high density substrate layer.

* * * * *